United States Patent

[11] 3,573,764

[72] Inventor Loren E. Larsen
Arvada, Colo.
[21] Appl. No. 845,851
[22] Filed July 29, 1969
[45] Patented Apr. 6, 1971
[73] Assignee International Business Machines Corporation
Armonk, N.Y.

[54] DUAL BILATERAL FLOATING GATE SWITCH

3 Claims, 1 Drawing Fig.

[52] U.S. Cl. .......... 340/174, 307/250, 307/270
[51] Int. Cl. .......... G11c 7/00, G11c 11/02
[50] Field of Search .......... 340/174 (M), (CDC), (Diode); 307/250, 270

[56] References Cited

UNITED STATES PATENTS 3,445,831 5/1969 Cooper et al. .......... 340/174

OTHER REFERENCES

Publication I - IBM Technical Disclosure Bulletin, Vol. 9, No. 7, Dec. 1966, pgs. 928— 929.

*Primary Examiner*—James W. Moffitt
*Attorneys*—Hanifin and Jancin and Herbert F. Somermeyer

ABSTRACT: An array of loads selectively receives reversed currents. Transistor load selectors are connected on each end of the loads in the array. First and second arrays of diodes are connected between transistors in one load selector to the loads, groups of such diodes are connected respectively to the transistors in a first load selector. The collector electrodes of such transistors are respectively connected to sets of diodes of the first array of diodes with the diodes being connected individually to sets of loads. The second array of diodes is poled to conduct current in an opposite direction and is arranged identically in sets but respectively connected to the emitter electrodes of such transistors. At the other end of the loads, in the second load selector, third and fourth arrays of diodes are connected in the same manner as described but to a second array of transistors. The two arrays of transistors are multiplexed to a single transformer drive means capable of supplying reverse currents over four electrical lines. Arrays of multiplexing diodes connected respectively to the emitter and collector electrodes of the transistors provide isolation of the transistors. Some isolation is provided within the transformer drive means dynamic electrical impedance. Control means are connected to the transistor arrays and to the drive means for effecting selective reverse current flow through any one of the loads in such array.

PATENTED APR 6 1971 3,573,764
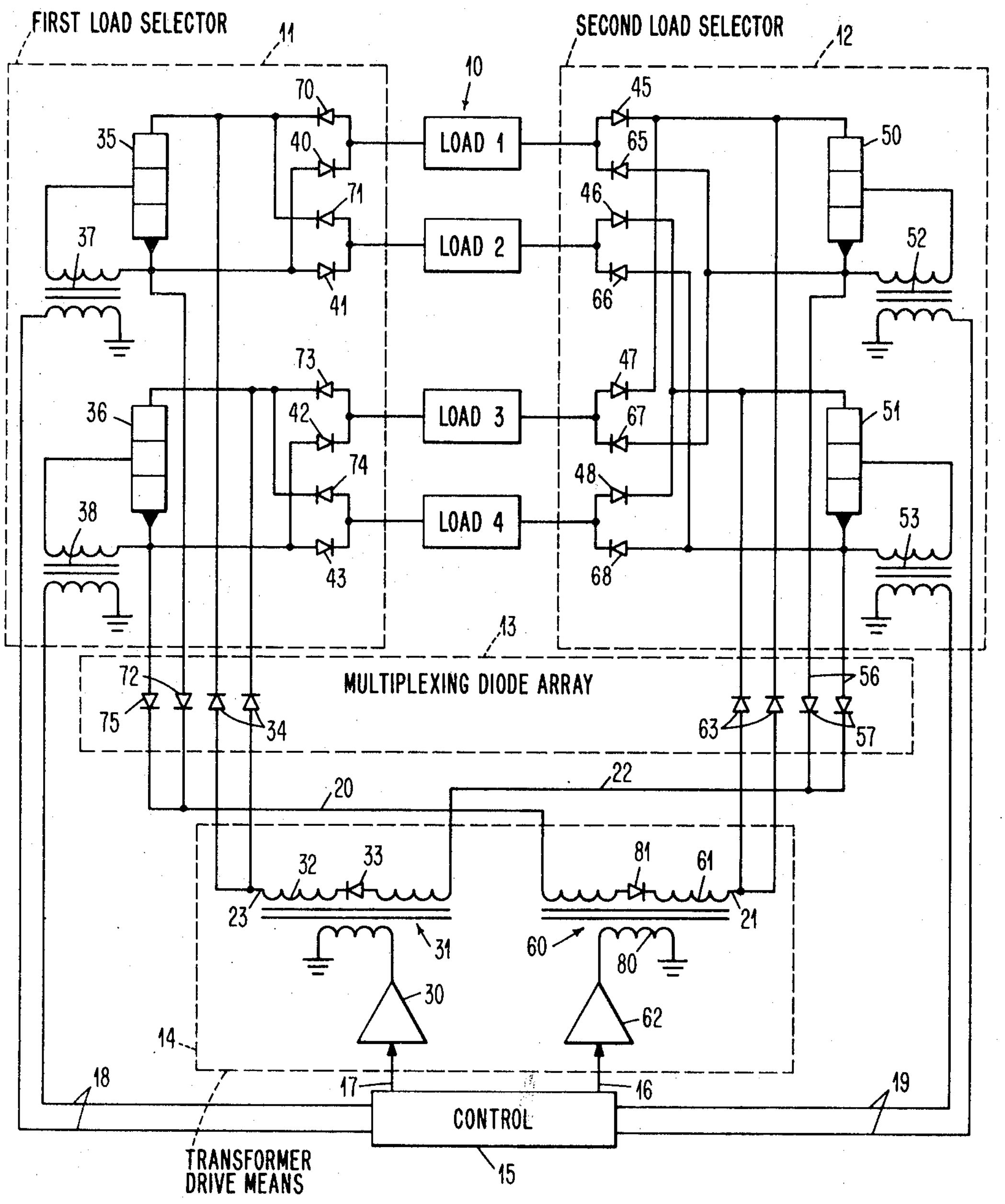
INVENTOR
LOREN E. LARSEN
BY Herbert F. Somermeyer
ATTORNEY

DUAL BILATERAL FLOATING GATE SWITCH

BACKGROUND OF THE INVENTION

The present invention relates to electrically actuated semiconductive current switches and particularly to those current switches capable of selectively supplying reversing currents to an array of loads.

An example of an array of loads requiring selectively reversible current flow therethrough is a magnetic core memory array wherein each drive line may be considered as a separate load. Such an array requires fast current reversing with relatively large current amplitudes. Also for reasons beyond the scope of this specification it is found to be desirable to DC isolate the array from circuitry associated therewith. This requires a transformer drive means to be interposed between the control circuitry and the array of loads, plus some form of DC isolation between the switch means and the control.

DC-isolated current reversing drive means have been provided through the use of transistors and transformers in an array connection. As an example, one such reversing current switch required four transistors per drive line. Transistors are a relatively expensive semiconductive element when compared with semiconductor diodes. Therefore, for reducing costs, it is desirable to reduce the number of transistors in a selection system. In some integrated circuits, a diode includes three zones of conductivity with the collector and base zone shorted together.

SUMMARY OF THE INVENTION

It is an object of the present invention to provide a selective current reversing switch for an array of loads which reduces the number of electrically controllable elements therein.

In accordance with the present invention, an array of loads selectively receive reversible currents through first and second load selectors. The first load selector has first and second arrays of diodes arranged in groups and respectively poled in opposite directions. Free ends of the diodes are connected to the respective loads with one diode from each of the two arrays being connected to the same load. The other ends of the diodes are grouped in sets. The sets in the respective arrays are connected to the collector and emitter electrodes of a first array of transistor elements. The second load selector is constructed identically to the first load selector. Bidirectional current means supplies current over four electrical lines, two of which are connected to the emitters of the transistors and two of which are connected to the collectors of the transistors. Diodes and the current means provide isolation between the various transistors to enable multiplexing each line to a plurality of transistors. The current paths prescribed by such connections go from the first line connected to a collector of a transistor, thence through the transistor, through one diode in one of said arrays, thence through the load, thence through another diode to the collector of a transistor in the second load selector, thence through the emitter to complete a current path. The second current path provides current in the opposite direction and can be traced in the same manner. Drive means includes a transformer secondary winding connected across the said drive lines.

The foregoing and other objects, features and advantages of the invention will be apparent from the following more particular description of a preferred embodiment of the invention, as illustrated in the accompanying drawing.

BRIEF DESCRIPTION OF THE FIGURE

The FIGURE is a schematic diagram of a system embodying the teachings of the present invention.

DETAILED DESCRIPTION OF THE DRAWING

The present invention is described with respect to an array 10 of loads 1, 2, 3, and 4, with no limitation thereto being intended. The small number of loads facilitates an understanding of the invention. Opposite ends of the loads in array 10 selectively receive reversible currents from first load selector 11 and second load selector 12. Multiplexing diode array 13 connects the load selectors 11 and 12 to transformer drive means 14, which is capable of supplying oppositely flowing currents to the array of loads through the two illustrated load selectors. As will become apparent, diodes in array 13 are poled to conduct current in a normal direction of current conduction of transistors in the load selectors. That is, if a diode is connected to an emitter and current flows out of such emitter (NPN) then such diode is poled to conduct current away from such emitter. Likewise, a diode connected to the collector of an NPN transistor is poled to conduct current into such collector, the normally expected direction of current flow in a collector of an NPN transistor. Control means 15 operates the whole system and selectively actuates the transformer drive means by control signals supplied respectively over lines 16 and 17 to supply currents in first and second directions. Control lines 18 and 19 respectively couple control means 15 to first and second load selectors 11 and 12 for controlling the actuation thereof to thereby select one, and only one, load in the array 10 to receive such current. It is understood in other embodiments of the present invention, more than one load may receive a given current.

Current paths for supplying current in the first direction through one of the loads in array 10 is first described. By arbitrary definition, current flowing in the first direction is flowing from first load selector 11 toward second load selector 12. Control means 15 supplies an actuating signal over line 17 which causes amplifier 30 to supply a large current pulse to transformer 31. Secondary winding 32 of transformer 31 is connected respectively across lines 22 and 23, thence to the multiplexing diode array 13. Current flow is limited to that in the direction of diode 33 which is connected inside the secondary winding 32 as is well known in the magnetic core memory art. Current flow is over line 23 to a first set of multiplexing diodes 34. These diodes have their cathodes respectively coupled to the collector electrodes of transistors 35 and 36 for supplying current thereto in a direction of normal current flow of such collector portions. Transistors 35 and 36 constitute a first array of transistor elements for selecting loads in array 10. Transistor 35 selects loads 1 and 2, while transistor 36 selects loads 3 and 4. Second load selector 12 determines which of the pairs of loads selected by the first array transistors 35 and 36 will receive current flowing in the first direction.

Transistors 35 and 36 are selectively actuated to current conduction by control signals supplied over control lines 18 and thence through transformers 37 and 38, respectively. Transformers 37 and 38 provide DC isolation of first load selector 11 from control means 15. The secondary windings of the transformers 37 and 38 are respectively connected between the base or control portions of transistors 35 and 36 and their emitter portions.

Current in the first direction supplied through either transistors 35 and 36 is then supplied to a second array of load selecting diodes. Such second array includes diodes 40 and 41 having their anodes connected together to the emitter portion of transistor 35, and their cathode portions connected respectively to loads 1 and 2 in array 10. Diodes 40 and 41 constitute a first set of diodes poled in the same direction within the second array of load selecting diodes. In a like manner, diodes 42 and 43 have their cathode portions connected respectively to loads 3 and 4 and with their anode portions connected together and to the emitter portion of transistor 36. Current flow is then through one of the four loads in array 10 toward second load selector 12.

Second load selector 12 is constructed in an identical manner to first load selector 11. Such identical construction reduces costs in fabrication of switches made in accordance with the present invention. Continuing on with the current flow in the first direction to one of the loads, the current is passed through one diode of third array of load selecting diodes constituted by diodes 45, 46, 47, and 48. Diodes 45 and 47 are a first set of diodes in the third array, having their anode portions respectively connected to loads 1 and 3, and with their cathode portions coupled together and to the collector electrode of transistor 50. Correspondingly, diodes 46 and 48 have their cathodes coupled together and to the collector portion of transistor 51, with their anode portions respectively connected to loads 2 and 4. Transistors 50 and 51 are selectively actuated by control signals supplied over lines 19; thence through transformers 52 and 53, respectively connected between the base and emitter portions of the two transistors. One, and only one, transistor 50 or 51 is actuated to current conduction at a given time. From inspection of the FIGURE, it is seen that current in the first direction is supplied through one, and only one, of the loads by actuating one of the two transistors 35 and 36 and one of the two transistors 50 and 51. For example, if load 1 is to receive the current, transistors 35 and 50 are simultaneously actuated to current conduction, while transistors 36 and 51 are maintained in a current nonconductive state. When the system is in quiescence, all four transistors will be current nonconductive.

Continuing with the current flow in the first direction, such current leaves one of the emitter portions of transistors 50 and 51; thence over one of the two lines 56, through a second set of multiplexing diodes 57; thence over line 22 to secondary winding 32 of transformer 31. Diodes 57 are poled to conduct current from the emitter portion of transistor 50 or 52 toward line 22 (i.e., the normal direction of current flow in such emitter portion). This completes the current path for supplying current to one of the loads in a first direction of flow.

Current flow in the second direction follows a similar path, but is supplied from second transformer 60 having a secondary winding 61 constructed identically to secondary winding 32. Current flow in the second direction is enabled by a control signal being supplied over line 16 to current supply amplifier 62, which then supplies a suitable current pulse to transformer 60. Current flow leaves secondary winding 61 over line 21 to a third set of multiplexing diodes 63; thence to the collector portions of transistors 50 and 51. As mentioned before, one and only one of the transistors 50 and 51 are actuated to current conduction at a given time. Current flow is through one of the two transistors; thence to a fourth array of load selecting diodes, consisting of diodes 65, 66, 67, and 68. The emitter portion of transistor 50 is connected to diodes 65 and 67, forming a first set of diodes in the fourth array and having cathode portions respectively connected to loads 1 and 3. It may be noted here that the first set of the fourth array of diodes is connected to the same loads (i.e., 1 and 3) as the first set of third array diodes 45 and 47. Therefore, transistor 50 will select loads 1 and 3, irrespective of direction of current flow. In a similar manner, when transistor 51 is actuated to current conduction, current flow is through one of the diodes 66 and 68, a second set in the fourth array of diodes, to either loads 2 or 4 as determined by first load selector 11.

First load selector 11 selects current flow in a second direction in the same manner that second load selector 12 selected current flow in the first direction. That is, current from loads 1 or 2 in array 10 will pass through diodes 70 or 71 to a common connection at the collector portion of transistor 35. If transistor 35 is current conductive, current then flows through diode 72, then over line 20, to return to secondary winding 61. In a similar manner, current supplied to either load 3 or 4 by second load selector 12, flows through one of the diodes 73 or 74 to the collector portion of transistor 36 and thence through diode 75 toward secondary winding 61. This completes the description of current flow in the second direction.

It is to be noted that the current paths in either the first or second direction flow through the same member components in the same general fashion in either direction, with first and second load selectors 11 and 12 being identically constructed to minimize construction costs of the current reversing switch. Multiplexing diode array 13 provides isolation and prevention of most sneak current paths, as will be fully explained. Multiplexing diode array 13 reduces the number of components required in the first and second load selectors.

When a plurality of loads is multiplexed in the manner just described from a single drive source, such as transformer drive means 14, care must be exercised in the design to prevent sneak current paths. For a complete understanding of the problems involved and how the invention solves these problems, the current paths in forward and reverse direction through load 1 is described in detail as to how sneak paths are blocked by the various components illustrated in the FIGURE. Current flow in the first direction through load 1 begins over line 23; thence through one of the two diodes 34 to the collector portion of transistor 35. Any current flow tending to flow through both loads 1 and 2 is blocked by diodes 70 and 71 (the first set of the second diode array) being reverse biased. Current flow is, therefore, through transistor 35; thence through diode 40 to load 1. Current flow apparently could go through diode 41 and load 2. However, when it attempts to flow through diode 46 and thence transistor 51, it is blocked at the collector portion thereof by transistor 51 being current nonconductive. Diode 63 blocks current flow from reaching line 21. Therefore, current must flow through load 1, diode 45, to the collector portion of transistor 50. The collector portion of transistor 50 is also connected to load 3; however, current flow is blocked by diode 47 (first set, third array) being reversed biased.

Current then flows through transistor 50 and one of the two diodes 57 to line 22, returning to the secondary winding 32. Such current also will attempt to flow through both diodes 65 and 67 in the first set of the fourth array. Diode 65 merely connects the emitter portion of transistor 50 back to load 1, thereby providing no current path. Diode 65, as to current leaving load 1, is reverse biased; thereby blocking the current flow in that direction. Current attempting to flow through diode 67, thence diode 47 back to the collector portion of transistor 50, is prevented since this is the original current path. Any current from diode 67 attempting to flow through load 3 in a second direction will have to flow through diode 73, but is blocked by transistor 36 being current nonconductive. Diodes 74 and 42 also block current flow from load 3.

Another possible current path is from the emitter portion of transistor 35, thence through diode 72 over line 20, through secondary winding 61, thence line 21 through one of the diodes 63 to the collector portion of transistor 50. It is immediately apparent that this current path is in parallel circuit relationship to the current path including diode 40, load 1, and diode 45. Such parallel path through secondary winding 61 blocks current flow by the feature that the dynamic electrical impedance of secondary winding 61 is made large when compared with dynamic electrical impedance of load 1. Therefore, substantially all current flows through load 1. This action can be accomplished in two ways. One way is to cause current supply amplifier 62 to present an open circuit to transformer 60, primary winding 80, then by mutual inductance such open circuit appears in the secondary winding 61 as an extremely high impedance (i.e., practically an open circuit). Tests in a constructed embodiment of the present invention have shown successful operation in a magnetic core memory array, using the just-described technique. Alternately, amplifier 62 may be actuated by control 15 to provide an opposing voltage to thereby induce a voltage across secondary winding 61 in opposition to current flow. Diode 81 will then be reverse biased such that an extremely high impedance is presented. This arrangement is not preferred because of possible undamped oscillations within the switching system. Such opposite polarity signal in amplifier 62 would be coincident with amplifier 30 being actuated to provide current pulse flowing in the second direction. With respect to current flow in the second direction through load 1, the same possible sneak paths occur and are blocked in the same manner, but by components described with respect to the second current path.

It should be noted that, in the operation of the illustrated embodiment, capacitance of the various connections and in the loads is reflected through the diodes to the desired current path. Therefore, it is important in the practical construction of this invention that the capacitance of the various circuitry and of the loads be minimized if it is desired to have current pulses with short rise and fall times. In a core memory application, such capacitance if not controlled may limit the length of the drive lines represented by loads 1 through 4. That is, the present invention may find its most optimum usage in low cost, buffered type magnetic core memories.

The multiplexing of the loads by the first load selector 11, second load selector 12, and the multiplexing diode array 13 is easily expanded to a large number of loads in an array 10. The principles illustrated in the appended FIGURE are adaptable to much larger arrays than that illustrated. The efficiency (i.e., the number of transistors required per the number of loads in an array) will increase with the larger arrays. Of course, it should be borne in mind that the capacitance problem will be somewhat accentuated. Therefore, the size of the sets of diodes connected in parallel and common to the collectors or emitters of the controlling transistor switches is a determinative factor in the capacity problem. The smaller the sets of diodes within the first through fourth arrays of load selector diodes, the less the capacity problem; however, more transistors are then required.

While the invention has been particularly shown and described with reference to a preferred embodiment thereof, it will be understood by those skilled in the art that various changes in form and details may be made therein without departing from the spirit and scope of the invention.

I claim:

1. Selective current-reversing switching means for being connected to an array of loads which are to selectively receive reverse currents, the improvement including the combination:

first and second load selecting arrays of electrically-controllable unidirectional-current-conducting semiconductive switch means, each said switch means having emitter and collector portions;

a plurality of sets of unidirectional current conducting devices, all devices in each set respectively being poled to conduct current in a like direction and having first end portions for being connected to loads and second end portions electrically joined;

a first array of said sets arranged to conduct current in a first direction through loads connected thereto with said second end portions therein connected to said collector portions in said first array of switch means;

a second array of said sets with devices therein having said first end portions respectively connected to said first end portions of said devices in said first array of sets, but said devices being poled to conduct current through said loads in a direction opposite to said first direction and said second end portions respectively electrically connected to said emitter portions in said first array of switch means;

third and fourth arrays of said sets having said devices with first end portions respectively connected to said loads opposite to connections of such loads with said first and second arrays and said arrays having their respective devices poled to conduct current through the connected loads in said first and opposite directions, respectively, said second end portions therein being electrically connected to said emitter portions in said second array of switch means;

reversible current supply means having a first output portion connected between said emitter portions in said first array of switch means and said collector portions of said second array of switch means for selectively supplying current in a first direction through one of said loads and a second output portion connected between said emitter portions in said second array and said collector portions in said first array for selectively supplying current through one of said loads in said opposite direction and isolation means in said current supply means for establishing electrical circuit isolation between said loads; and said current supply means further includes a multiplexing diode array electrically interposed between said transformer drive means and said transistor arrays, said diode array including diodes respectively connected to all said emitter and collector portions of all said switch means and to said secondary windings, said diodes connected to conduct current in a direction of normal current flow of said respective portion to which said diodes are connected.

2. A magnetic core memory having a plurality of memory drive lines as an array of loads to selectively receive reverse currents, the improvement including the combination: first and second arrays of load selecting transistors, each transistor having collector, base, and emitter portions and when current conductive to conduct current in a normal direction between said collector and emitter portions and capable of being current nonconductive;

first and second arrays of diodes respectively electrically coupling said first and second transistor arrays to opposite ends of said loads, each end of each said loads being connected to two diodes respectively electrically connected to collector and emitter portions of one of said transistors, said two diodes each poled to conduct current with respect to said portions to which connected in accordance with said normal direction of current flow in said respective transistor; and diode multiplexing means having a pair of diodes connected to each said transistor, diodes in each pair being respectively connected to said collector and emitter portions and poled to conduct current with respect to said respective portions to which connected in a direction the same as said normal direction in said respective portions, like poled ones of said pairs of diodes connected respectively to transistors in said first and second arrays being connected together such that four electrical lines are adapted to supply reverse currents.

3. The memory set forth in claim 2 further including reverse current supply means having transformer means with first and second output windings respectively connected across a pair of said electrical lines, one line in each pair being connected via said diode multiplexing means to an emitter portion of said transistors respectively in opposite ones of said arrays while another line in each pair being connected via said diode multiplexing means to collector portions of said transistors respectively in another ones of said arrays, said reverse current supply means operative to alternately supply a current through one of said output winding means and simultaneously a high dynamic impedance at another of said output winding means and then a current through said another output winding means and a high dynamic impedance.